United States Patent [19]
Lee

[11] Patent Number: 5,879,838
[45] Date of Patent: Mar. 9, 1999

[54] CONTACT MASK HAVING GUARD RING PATTERNS FOR MANUFACTURING A SEMICONDUCTOR DEVICE

[75] Inventor: Geun Ho Lee, Ichon-Shi, Rep. of Korea

[73] Assignee: Hyundai Electronics Industries Co., Kyungki-Do, Rep. of Korea

[21] Appl. No.: 876,713

[22] Filed: Jun. 16, 1997

[30] Foreign Application Priority Data

Feb. 20, 1997 [KR] Rep. of Korea .................. 1996 22780

[51] Int. Cl.⁶ ...................................................... G03F 9/00
[52] U.S. Cl. .............................................................. 430/5
[58] Field of Search ............................... 430/5, 311, 312, 430/322

[56] References Cited

U.S. PATENT DOCUMENTS

| | | | |
|---|---|---|---|
| 4,481,041 | 11/1984 | Müller | 148/1.5 |
| 5,578,422 | 11/1996 | Mizuno et al. | 430/313 |

FOREIGN PATENT DOCUMENTS

| | | |
|---|---|---|
| 62-50811 | 10/1987 | Japan . |
| 6-275492 | 9/1994 | Japan . |
| 7-253649 | 10/1995 | Japan . |

*Primary Examiner*—S. Rosasco
*Attorney, Agent, or Firm*—Scott C. Harris, Esq.

[57] ABSTRACT

A contact mask having guard ring patterns for manufacturing a semiconductor device which can prevent a lifting of a photoresist film in guard ring regions. A first guard ring pattern and a second guard ring pattern in the contact mask are formed along the perimeter portion of contact patterns in the contact mask. The first and second guard ring patterns have a plurality of discontinuous patterns, respectively. Each of the discontinuous patterns of the first guard ring pattern and each of the discontinuous patterns of the second guard ring pattern are formed in a zigzag pattern relative to each other. During the etching process using the contact mask, a photoresist pattern for the guard ring is not lifted due to an insufficient area existing between the photoresist pattern and an insulating layer in the guard ring region.

2 Claims, 5 Drawing Sheets

5,879,838

CONTACT MASK HAVING GUARD RING PATTERNS FOR MANUFACTURING A SEMICONDUCTOR DEVICE

BACKGROUND OF THE INVENTION

1. Field of the Invention

The present invention relates to a contact mask having guard ring patterns used for manufacturing a semiconductor device and, more particularly to a contact mask having guard ring patterns which can prevent a lifting of a photoresist film in guard ring regions.

2. Brief Description of the Prior Arts

Generally, in a manufacturing process of the semiconductor device, a connection between the junction and the conductive layer or between the conductive layers is accomplished by a contact hole formed in an insulating layer. Also, when the contact hole is formed, a guard ring is formed on the insulating layer along an edge of a die. The guard ring is formed to prevent defects due to an electrical influence between neighboring dies upon a wafer level test. A conventional contact mask used for forming a contact hole and a guard ring will be explained below by reference to FIG. 1.

FIG. 1 is a partial plan view of a conventional contact mask. In a contact mask 9, a transparent substrate 1 is made of materials such as quartz. A plurality of contact patterns 4 are formed on the substrate 1. A first guard ring pattern 2 and a second guard ring pattern 3 are located along the around portion of the contact patterns 4, respectively. Each of the first and second guard ring patterns 2 and 3 has a continuous pattern with a line shape. The second guard ring pattern 3 is located at an inside of the first guard ring pattern 2.

The process for forming a contact hole and a guard ring using the contact mask having a structure described above will be explained by reference to FIGS. 2 and 3.

FIG. 2 is a partial plan view of one of the dies for explaining the state in which a lithography process is implemented using the contact mask 9 shown in FIG. 1, and FIG. 3 is a cross-sectional view taken along line 3—3 of FIG. 2. A photoresist film 5 is formed on an insulating layer 7 formed on a silicon substrate 8, the photoresist film 5 is then patterned through the exposure and development process using the contact mask 9 as shown in FIG. 1. The insulating layer 7 is wet etched at a given depth and the remaining insulating layer 7 is then dry etched using the patterned photoresist film 5 as a mask to form a plurality of contact holes 6 in the insulating layer 7. Meanwhile, during etching processes, the outside portion of the insulating layer 7 corresponding to the first and second guard ring patterns 2 and 3 of the contact mask 9 is etched, thus a first guard ring g1 and a second guard ring g2 are formed.

In manufacture of a highly integrated device, since a BPSG film containing a large amount of impurity ions is used as the insulating layer 7 to improve the flatness of the surface, the etching rate of the insulating layer 7 made of BPSG is increased in a wet etching. Due to characteristics of wet etching, the insulating layer 7 is laterally overetched, and the photoresist film 5, which is formed on the insulating layer 7 between the first guard ring g1 and the second guard ring g2 after a wet etching process, is lifted. The lifted photoresist film 5 is buried into an adjacent contact hole 6, therefore, the contact holes having a complete structure can not be formed through a following dry etching process so that the device is defective. As a result, yield of the device is lowered.

SUMMARY OF THE INVENTION

Therefore, an object of the invention is to provide a contact mask having guard ring patterns for manufacturing a semiconductor device which can solve the above mentioned problems by increasing the contact area between the photoresist film and the insulating layer in the guard ring regions.

In order to achieve the object described above, a contact mask having guard ring patterns for manufacturing a semiconductor device are provided. The guard ring patterns comprise a first guard ring pattern located along the perimeter of contact patterns. The first guard ring pattern has a plurality of discontinuous patterns with a rectangular shape. A second guard ring pattern is located inside of the first guard ring pattern. The second guard ring pattern has a continuous pattern with a line shape.

Also, a contact mask having guard ring patterns for manufacturing a semiconductor device is disclosed. The guard ring patterns include a first guard ring pattern located along the perimeter portion of contact patterns. The first guard ring pattern has a plurality of discontinuous patterns with a rectangular shape. A second guard ring pattern is located inside of the first guard ring pattern. The second guard ring pattern has a plurality of discontinuous patterns with a rectangular shape, wherein each of the discontinuous patterns of the first guard ring pattern and each of the discontinuous patterns of the second guard ring pattern are formed in zigzags relative to each other.

The present invention will be described below in detail by reference to the accompanying drawings.

DESCRIPTION OF THE INVENTION

Figure 4:
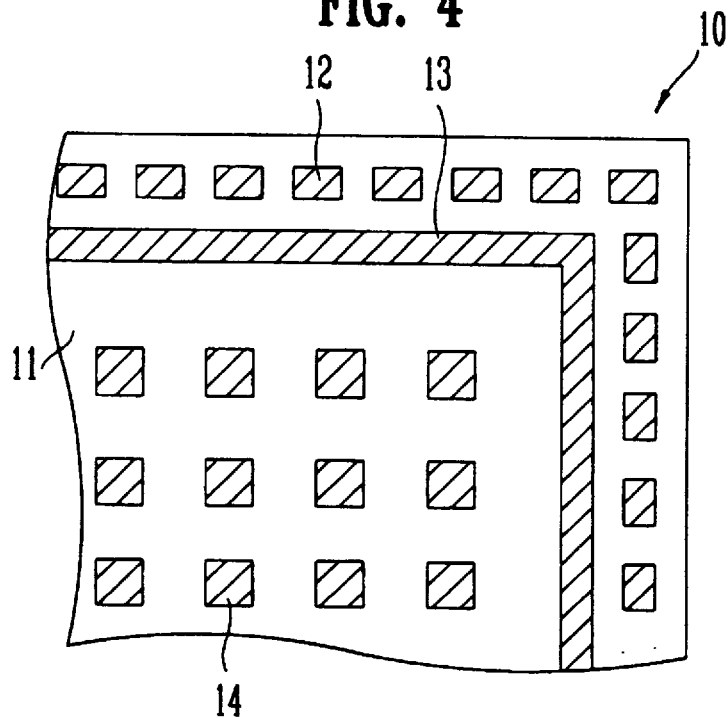
FIG. 4 is a partial plan view of the contact mask in accordance with an embodiment of the present invention.

FIG. 4 is a partial plan view of the contact mask in accordance with an embodiment of the present invention. In a contact mask 10 according to the embodiment, a transparent substrate 11 is made of a material such as quartz. A plurality of contact patterns 14 is formed on the substrate 11. A first guard ring pattern 12 and a second guard ring pattern 13 are located along the around portion of the contact patterns 14, respectively. The first guard ring pattern 12 has a plurality of discontinuous patterns with a rectangular shape and the second guard ring pattern 13 has a continuous pattern with a line shape. The second guard ring pattern 13 is located inside of the first guard ring pattern 12.

The process for forming a contact hole and a guard ring using the contact mask as described above will be explained by reference to FIGS. 5, 6A and 6B.

Figure 1:
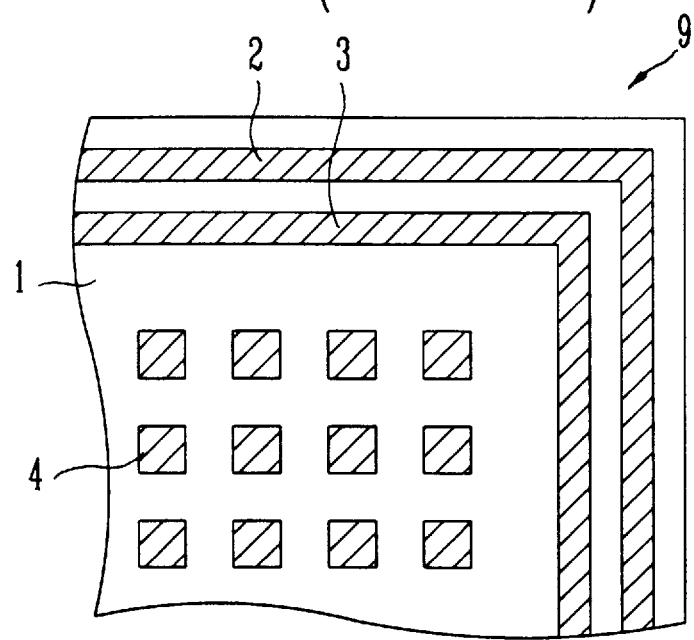
FIG. 1 is a partial plan view of a conventional contact mask.
Figure 2:
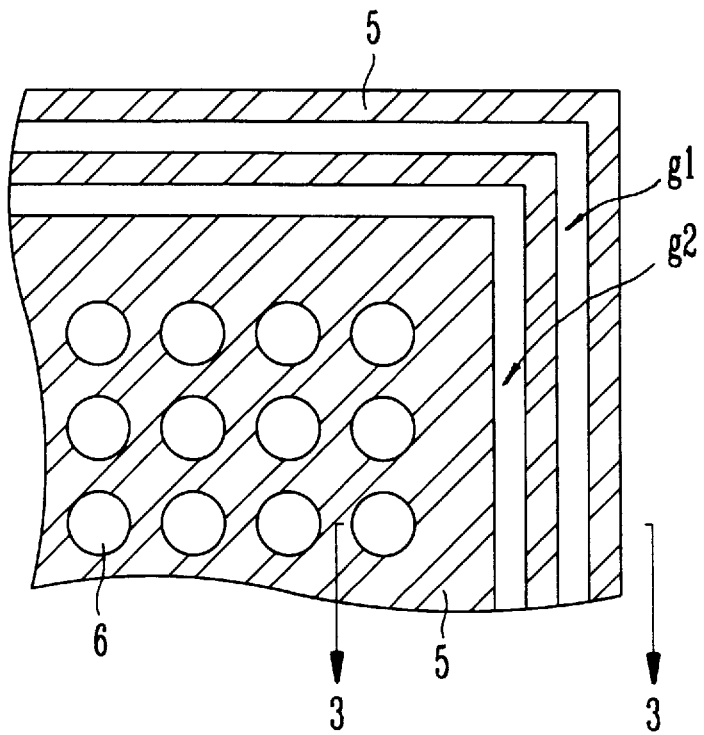
FIG. 2 is a partial plan view of one of the dies for explaining the state in which a lithography process is implemented using the contact mask shown in FIG. 1.
Figure 3:
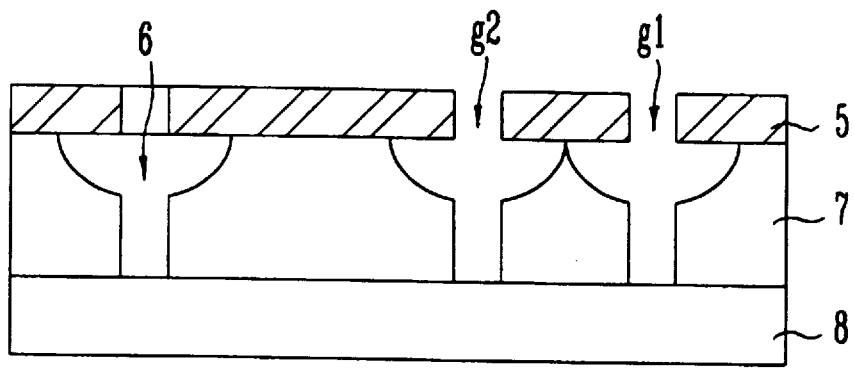
FIG. 3 is a cross-sectional view taken along line 3—3 of FIG. 2.
Figure 6A:
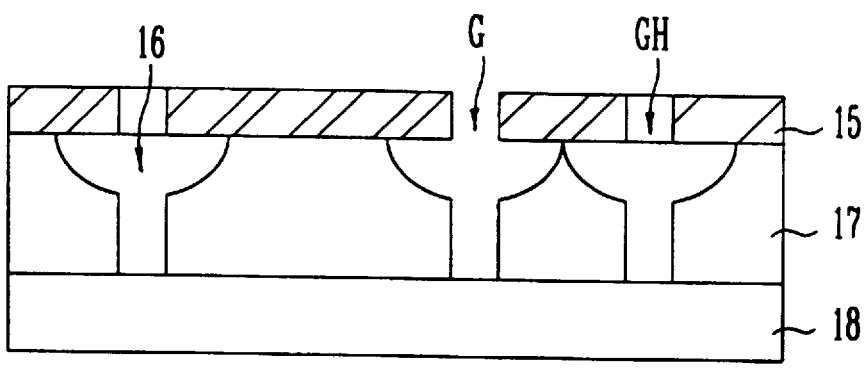
FIG. 6A is a cross-sectional view taken along line 6A—6A of FIG. 5.
Figure 6B:
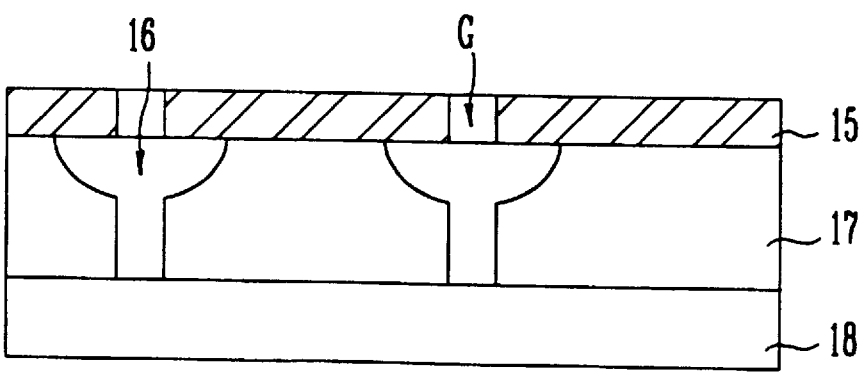
FIG. 6B is a cross-sectional view taken along line 6B—6B of FIG. 5.
Figure 5:
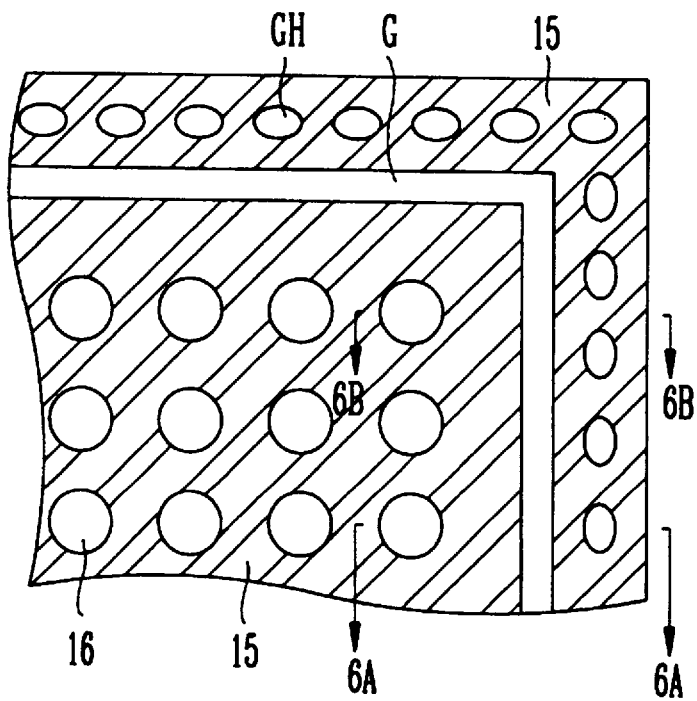
FIG. 5 is a partial plan view of one of the dies for explaining the state in which a lithography process is implemented using the contact mask shown in FIG. 4.

FIG. 5 is a partial plan view of one of the dies for explaining the state in which a lithography process is implemented using the contact mask shown in FIG. 6, FIG. 6A is a cross-sectional view taken along line 6A—6A of FIG. 5, and FIG. 6B is a cross-sectional view taken along line 6B—6B of FIG. 5. An insulating layer 17 and a photoresist film 15 are formed on a silicon substrate 18 sequentially, the photoresist film 15 is then patterned by the exposure and development processes using the contact mask 10 shown in FIG. 4. The insulating layer 17 is wet etched at a given depth and the remaining insulating layer 17 is then dry etched using the patterned photoresist film 15 as a mask to form a plurality of contact holes 16 in the insulating layer 17. Meanwhile, as shown in FIG. 5, a plurality of guard ring holes GH and guard ring G are formed in the insulating layer 17 by the first guard ring pattern 12 and the second guard ring pattern 13 of the mask 10.

Here, during a wet etching process, the etching rate of the insulating layer 17 made of BPSG is increased. Due to characteristic of the wet etching, the insulating layer 17 is laterally overetched, thus the photoresist film 15 located on portion between the guard ring G and the each guard ring hole GH are in unstable state as shown in FIG. 6A However, as shown in FIG. 6B, the photoresist film 15 located on portions between the guard ring G and the insulating layer 17 on which the guard ring hole GH is not formed maintains stability. Therefore, although a partial lifting of the photoresist film 15 is occurred at portion between the each guard ring hole GH and the guard ring G (FIG. 6A), there is an enough contact area between the insulating layer 17 and the photoresist film 15 at the portions between the guard ring G and the insulating layer 17 on which the guard ring hole GH is not formed so that the photoresist film 15 can be maintained stable state on the whole.

Figure 7:
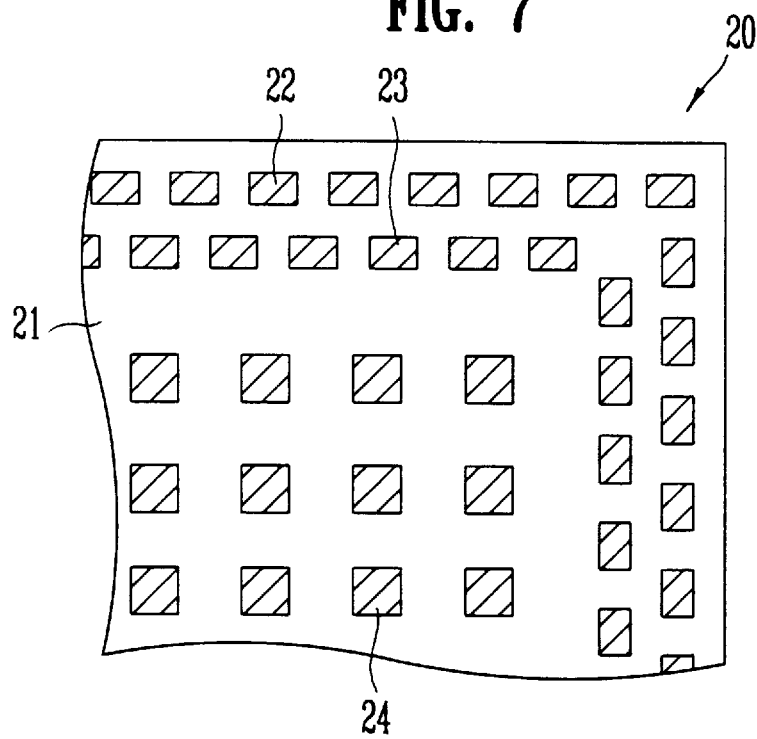
FIG. 7 is a partial plan view of the contact mask in accordance with another embodiment of the present invention.

FIG. 7 is a partial plan view of the contact mask in accordance with another embodiment of the present invention. In a contact mask 20 according to the embodiment, a transparent substrate 21 is made of materials such as quartz. A plurality of contact patterns 24 is formed on the substrate 11. A first guard ring pattern 22 and a second guard ring pattern 23 are located along the around portion of the contact patterns 24, respectively. Each of the first and second guard ring patterns 22 and 23 has a plurality of discontinuous patterns with a rectangular shape. The second guard ring pattern 23 is located at inside of the first guard ring pattern 22. Each of the discontinuous patterns of the second guard ring pattern 23 are formed in zigzags relative to each other.

The process for forming a contact hole and a guard ring using the contact mask described above will be explained by reference to FIGS. 8, 9A and 9B.

Figure 8:
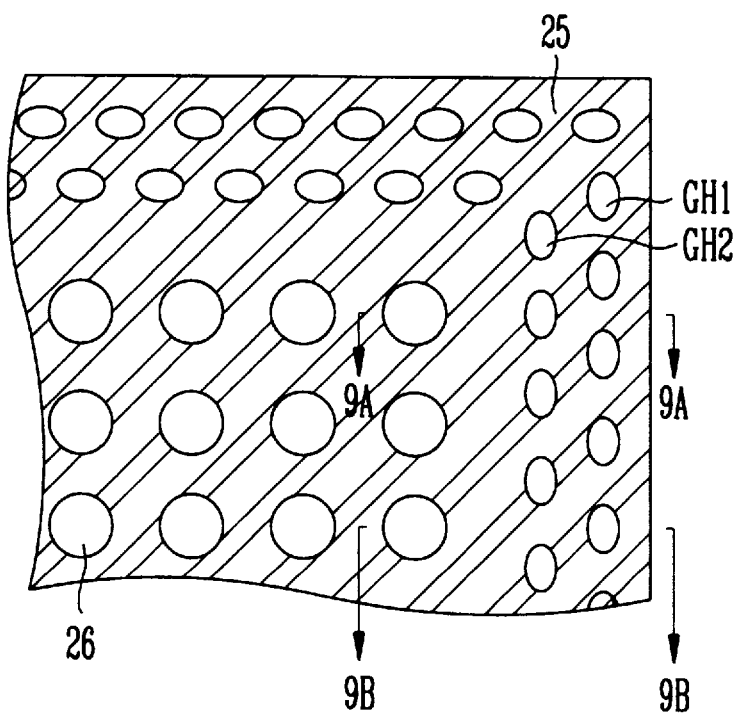
FIG. 8 is a partial plan view of one of the dies for explaining the state in which a lithography process is implemented using the contact mask shown in FIG. 7.
Figure 9A:
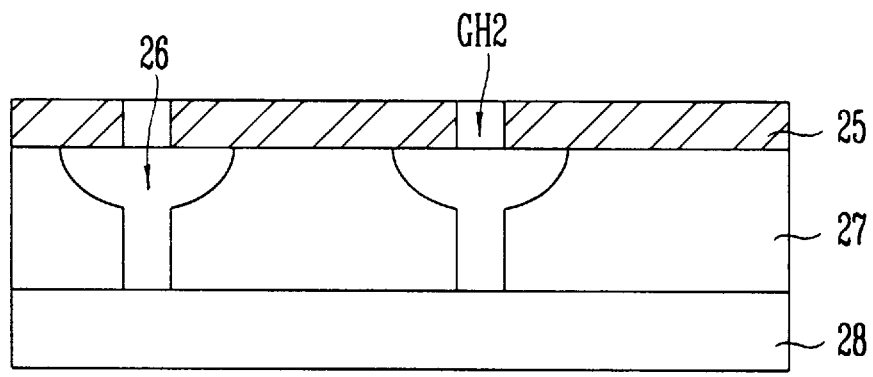
FIG. 9A is a cross-sectional view taken along line 9A—9A of FIG. 8.
Figure 9B:
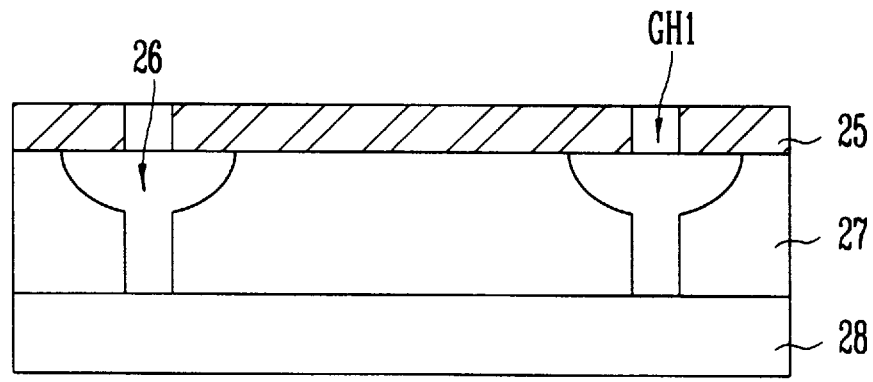
FIG. 9B is a cross-sectional view taken along line 9B—9B of FIG. 8.

FIG. 8 is a partial plan view of one of the dies for explaining the state in which a lithography process is implemented using the contact mask shown in FIG. 7, FIG. 9A is a cross-sectional view taken along line 9A—9A of FIG. 8, and FIG. 9B is a cross-sectional view taken along line 9B—9B of FIG. 8.

An insulating layer 27 and a photoresist film 25 are formed on a silicon substrate 28 sequentially, the photoresist film 25 is then patterned by the exposure and development processes using the contact mask 20 shown in FIG. 7. The insulating layer 27 is wet etched at a given depth and the remaining insulating layer 27 is then dry etched using the patterned photoresist film 25 as a mask to form a plurality of contact holes 26 in the insulating layer 27. Meanwhile, as shown in FIG. 8, a plurality of first guard ring holes GH1 and the second guard ring holes GH2 are formed in the insulating layer 27 by the first guard ring pattern 22 and the second guard ring pattern 23 of the mask 20, respectively.

As described above, during a wet etching process, the etching rate of the insulating layer 27 made of BPSG is increased. Due to a characteristic of the wet etching, the insulating layer 27 is laterally overetched. However, as shown in FIGS. 9A and 9B, any guard ring hole which is the cause the lifting of the photoresist film 25 does not exist at both sides of the each guard ring hole GH1 or GH2. As a result, the photoresist film 25 can be maintained stable state on the whole since an enough contact area between the photoresist film 25 and the insulating layer 27 exists As explained above, according to the present invention, a contact area between the photoresist film and the insulating layer is increased, thereby preventing a lifting of the photoresist film. As a result, a complete contact hole can be formed to improve a yield of the device.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A contact mask having guard ring patterns for manufacturing a semiconductor device, the guard ring patterns comprising:

a first guard ring pattern located along a perimeter portion of contact patterns, said first guard ring pattern having a plurality of discontinuous patterns with a rectangular shape; and a second guard ring pattern located inside of said first guard ring pattern, said second guard ring pattern having a continuous pattern with a line shape.

2. A contact mask having guard ring patterns for manufacturing a semiconductor device, the guard ring patterns comprising:

a first guard ring pattern located along a perimeter portion of contact patterns, said first guard ring pattern having a plurality of discontinuous patterns with a rectangular shape; and a second guard ring pattern located inside of said first guard ring pattern, said second guard ring pattern having a plurality of discontinuous patterns with a rectangular shape;

wherein each of said discontinuous patterns of said first guard ring pattern and each of said discontinuous patterns of said second guard ring pattern are formed in an offset manner from each other.

* * * * *